(12) United States Patent
Koo et al.

(10) Patent No.: US 7,052,931 B2
(45) Date of Patent: May 30, 2006

(54) FLAT PANEL DISPLAY DEVICE WITH FIRST ELECTRODE HAVING CONCENTRATION GRADIENT AND FABRICATION METHOD THEREOF

(75) Inventors: Jae-Bon Koo, Yongin (KR);
Dong-Chan Shin, Hwaseong (KR)

(73) Assignee: Samsung SDI Co., Ltd., Suwon-si (KR)

( * ) Notice: Subject to any disclaimer, the term of this patent is extended or adjusted under 35 U.S.C. 154(b) by 0 days.

(21) Appl. No.: 11/092,891

(22) Filed: Mar. 30, 2005

(65) Prior Publication Data

US 2005/0170552 A1     Aug. 4, 2005

Related U.S. Application Data

(63) Continuation of application No. 10/895,925, filed on Jul. 22, 2004, now Pat. No. 6,902,943.

(30) Foreign Application Priority Data

Dec. 26, 2001   (KR)   ............................... 2001-85210

(51) Int. Cl.
*H01L 51/40*     (2006.01)
*H01L 21/00*     (2006.01)
(52) U.S. Cl. ........................... 438/99; 438/37; 438/29; 257/E51.019; 257/E33.043; 257/E33.064
(58) Field of Classification Search ............... None
See application file for complete search history.

(56) References Cited

U.S. PATENT DOCUMENTS

| | | | |
|---|---|---|---|
| 5,633,195 | A | 5/1997 | Guthrie et al. |
| 5,990,555 | A | 11/1999 | Ohori et al. |
| 6,005,295 | A | 12/1999 | Hattori |
| 6,075,317 | A | 6/2000 | Keyser et al. |
| 6,323,917 | B1 | 11/2001 | Fujikawa et al. |
| 2001/0006255 | A1 | 7/2001 | Kwon et al. |

OTHER PUBLICATIONS

U.S. Appl. No. 10/288,509, filed Nov. 6, 2002, Shin et al.
U.S. Appl. No. 10/288,486, filed Nov. 6, 2002, Koo et al.
Office Action issued in related Chinese Patent Application No. 02158450.8.

*Primary Examiner*—David A. Zarneke
(74) *Attorney, Agent, or Firm*—Stein, McEwen & Bui, LLP

(57) ABSTRACT

A method of fabricating a flat panel display comprises forming a first electrode, forming at least one organic electroluminescent layer on the first electrode, forming an second electrode, wherein the first electrode comprises a first component of a transparent material and a second component of a metallic material, and the forming of the first electrode comprises depositing the first and second components so as to have a gradual concentration gradient in which the first component is decreased while the second component is increased at a part in contact with the exposed electrode, according to a thickness of the first electrode. The first electrode functions as a pixel electrode and a black matrix of the flat panel display.

6 Claims, 5 Drawing Sheets

FLAT PANEL DISPLAY DEVICE WITH FIRST ELECTRODE HAVING CONCENTRATION GRADIENT AND FABRICATION METHOD THEREOF

CROSS-REFERENCE TO RELATED APPLICATIONS

This application is a continuation of application Ser. No. 10/895,925, filed Jun. 22, 2004, now U.S. Pat. No. 6,902,943. This application claims the benefit of Korean Patent Application No. 2001-85210 filed on Dec. 26, 2001, in the Korean Intellectual Property Office, the disclosure of which is incorporated herein by reference.

BACKGROUND OF THE INVENTION

1. Field of the Invention

The present invention relates to a flat panel display device, and more particularly, to a front light emitting type organic electroluminescent display device with a first electrode having a concentration gradient which functions as a pixel electrode and a black matrix at the same time, and a method of fabricating the front light emitting type organic electroluminescent display device.

2. Description of the Related Art

FIG. 1A illustrates the cross-sectional structure of a conventional front light emitting type organic electroluminescent (EL) display device. FIG. 1B illustrates the plan structure of a conventional organic electroluminescent display device. FIG. 1A illustrates the cross-sectional structure taken along the line I—I of FIG. 1B.

Referring to FIG. 1A and FIG. 1B, a transparent insulation substrate 10 is divided into a first region 11 in which a pixel electrode is formed, and a second region 12 in which a thin film transistor (TFT) and a capacitor are formed. The second region 12 includes a semiconductor layer 20 in which source/drain regions 21 and 22 are formed, a thin film transistor equipped with a gate electrode 31 and source/drain electrodes 51 and 52, and a capacitor equipped with a first electrode 32, and a second electrode 53 connected to the source electrode 51 of the thin film transistor.

A gate insulating layer 30 is formed in a space between the semiconductor layer 20 and the gate electrode 31.

An interlayer insulating layer 40 is formed in a space between the gate electrode 31 and the source/drain electrodes 51 and 52.

A pixel electrode 70 connected to one of the source/drain electrodes 51 and 52, e.g., the drain electrode 52 through a via hole 61, is formed on a passivation layer 60 of the first region 11 as an anode electrode. A planarization layer 80 equipped with an opening part 81 which exposes a portion of the pixel electrode 70 is formed on the pixel electrode 70. An organic EL layer 90 is formed in the opening part 81, and a transparent electrode 95 is formed on the organic EL layer 90 as a cathode electrode.

References 35, 55 and 56 of FIG. 1B represent gate lines, data lines and power supply lines, respectively.

In the above described conventional front light emitting type organic electroluminescent display device, contrast deteriorates because a material having a high reflection ratio is used, thereby reflecting an external light through a metal wiring material, particularly a metallic material for source/drain electrodes.

Although the external light can be prevented from being reflected by adhering a polarizer onto a front of the conventional organic electroluminescent display device, using the polarizer is expensive, and a luminance of the organic electroluminescent display device is lowered because a transmittancy of light emitted from an organic electroluminescent (EL) layer of the organic electroluminescent display device is lowered by the polarizer. Furthermore, a life cycle of the organic EL layer is shortened where a current flowing through the conventional organic electroluminescent display device is increased to improve the luminance of the organic electroluminescent display device.

SUMMARY OF THE INVENTION

Accordingly, it is an object of the present invention to provide a flat panel display device having a black matrix which prevents reflection of an external light.

Another object of the present invention is to provide a simplified method of fabricating a flat panel display device where a black matrix and a pixel electrode of the flat panel display device are simultaneously formed by using a conductive layer having a predetermined concentration gradient of a transparent conductive material and a metallic material.

Yet another object of the present invention is to provide a flat panel display device which prevents formation of a surface profile due to a use of a black matrix, and a method of fabricating the flat panel display device thereof.

Still another object of the present invention is to provide a flat panel display device which reduces a surface resistance and a contact resistance of source/drain electrodes by using an Al series material as the source/drain electrodes, and a method of fabricating the flat panel display device thereof.

Additional objects and advantages of the invention will be set forth in part in the description which follows and, in part, will be obvious from the description, or may be learned by practice of the invention.

To achieve the above and other objects of the present invention, there is provided a method of fabricating a flat panel display, the method comprising forming a first electrode; forming at least one organic electroluminescent layer on the first electrode; forming a second electrode; wherein the first electrode comprises a first component of a transparent material and a second component of a metallic material, and the forming of the first electrode comprises depositing the first and second components so as to have a gradual concentration gradient in which the first component is decreased while the second component is increased at a part in contact with the exposed electrode, according to a thickness of the first electrode.

According to an aspect of the present invention, the first electrode functions as a black matrix as well as a pixel electrode of the display device.

The first component of the first electrode may be one of ITO, IZO and ZnO, and the second component thereof may be one of Al, Cr, Mo, Ti, Ag, Au and W. The first electrode may be deposited by one of co-sputtering and co-evaporating the transparent first material and the metallic second material.

BRIEF DESCRIPTION OF THE DRAWINGS

These and other objects and advantages of the present invention will become apparent and more readily appreciated from the following description of the embodiments, taken in conjunction with the accompanying drawings of which.

DETAILED DESCRIPTION OF THE PREFERRED EMBODIMENTS

Figure 1A:
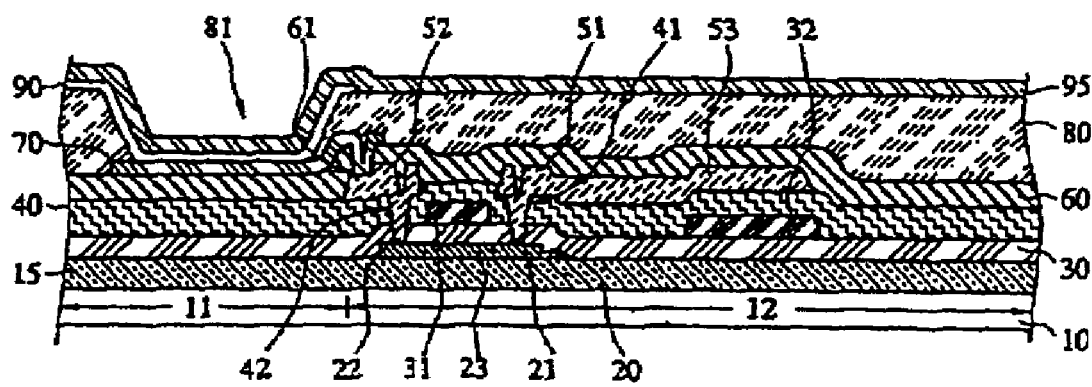
FIG. 1A is a cross-sectional view of a conventional organic electroluminescent display device.
Figure 1B:
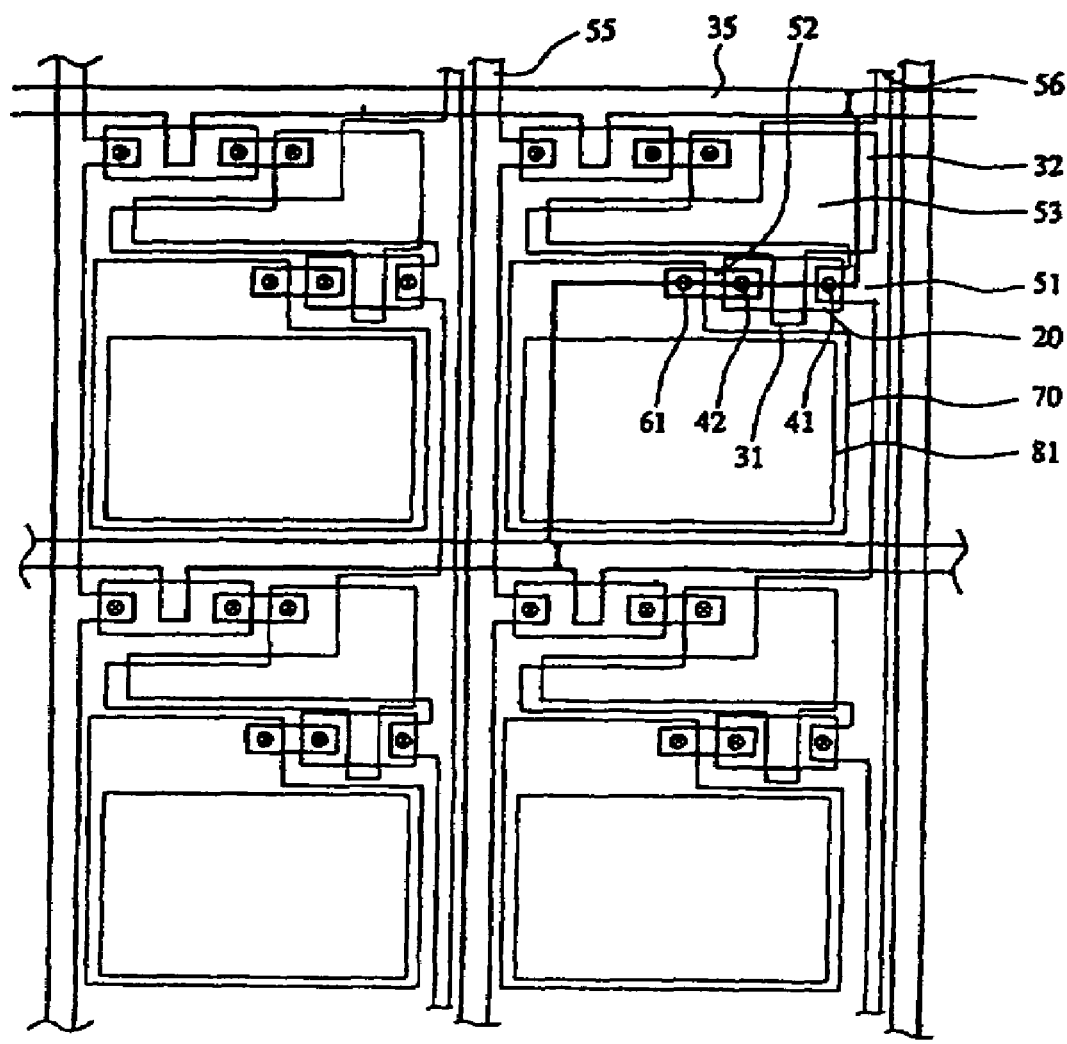
FIG. 1B is a plan view of the conventional organic electroluminescent display device shown in FIG. 1A.

Reference will now be made in detail to the embodiments of the present invention, examples of which are illustrated in the accompanying drawings, wherein like reference numerals refer to the like elements throughout. The embodiments are described below in order to explain the present invention by referring to the figures.

Figure 2A:
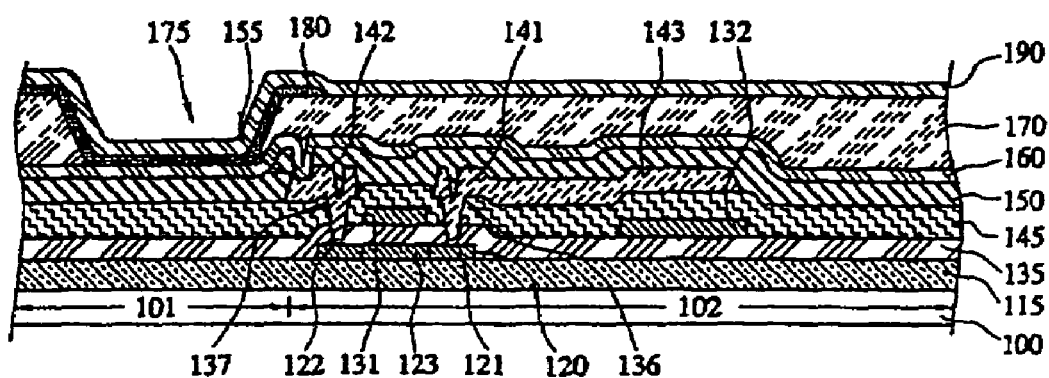
FIG. 2A is a cross-sectional view of an organic electroluminescent display device according to an embodiment of the present invention.
Figure 2B:
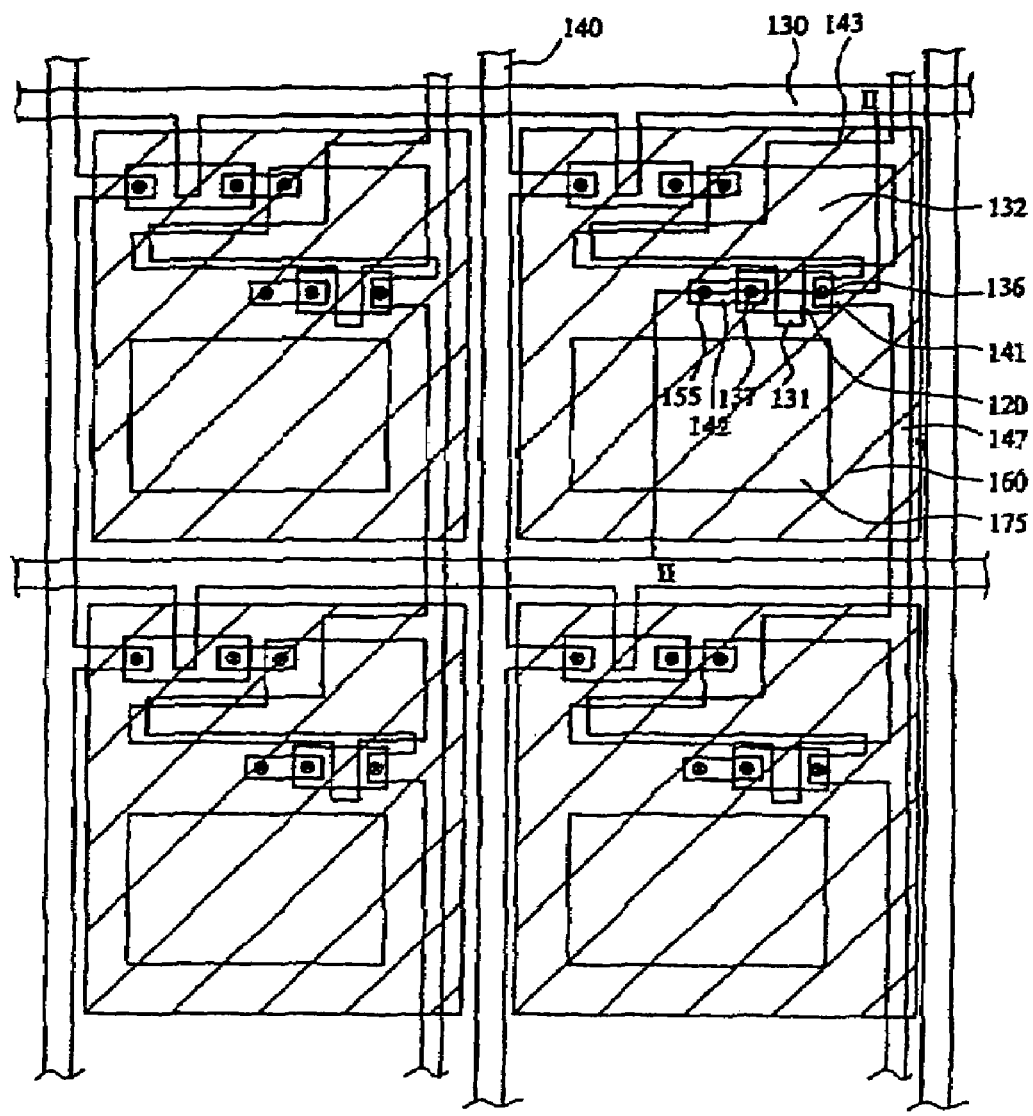
FIG. 2B is a plan view of the organic electroluminescent display device shown in FIG. 2A.

FIG. 2A shows a cross-sectional view of an organic electroluminescent display device according to an embodiment of the present invention, and FIG. 2B shows a plan view of the organic electroluminescent display device, wherein the FIG. 2A illustrates a cross-sectional structure taken along the line II—II of FIG. 2B.

Referring to FIG. 2A and FIG. 2B, the display device includes an insulation substrate 100 having a first region 101 to form a pixel electrode, and a second region 102 to form a thin film transistor (TFT) and a capacitor. A buffer layer 115 is formed on the insulation substrate 100. The thin film transistor (TFT) is formed in a second region 102 of the insulation substrate 100. The TFT comprises a semiconductor layer 120 equipped with n or p type source/drain regions 121 and 122, a gate electrode 131, and source/drain electrodes 141 and 142, each of which is connected to the source/drain regions 121 and 122 through contact holes 136 and 137, respectively.

A capacitor having a first electrode 132 and a second electrode 143 connected to the source electrode 141 are formed in the second region 102. Each of insulation layers, e.g., a gate insulation layer 135 and an interlayer insulation layer 145, are formed in a space surrounded by the semiconductor layer 120, gate electrode 131 and first electrode 132, and a space surrounded by the gate electrode 131, first electrode 132 and source/drain electrodes 141 and 142, respectively. A part between the first electrode 132 and the second electrode 143 in the interlayer insulation layer 145 functions as a capacitor dielectric layer.

A passivation layer 150 is formed on the interlayer insulation layer 145 equipped with the TFT and the capacitor. A via hole 155, which exposes a part of one electrode out of the source/drain electrodes 141 and 142, e.g., the drain electrode 142, is formed by etching the passivation layer 150.

A first electrode 160 connected to the drain electrode 142 through the via hole 155 is formed on the passivation layer 150. An opening part 175 which exposes a part corresponding to a first region in the first electrode 160 is formed after forming an insulation layer 170 on a front face of the insulation substrate 100. An organic EL layer 180 is formed on the first electrode 160 exposed by the opening part 175, and a cathode electrode is formed on the organic EL layer 180 as a transparent electrode 190.

The insulation layer 170 formed on the passivation layer separation wall which prevents a short, and separates each of pixels of a pixel electrode (described herein below) under the insulation layer 170.

The first electrode 160 functions as an anode electrode which is a pixel electrode of the organic electroluminescent display device, as well as a black matrix which prevents reflection of an external incident light. Since the transparent electrode 190 is used as a cathode electrode, a material having a smaller work function from that of the first electrode 160, which functions as a pixel electrode, is used as a material for the transparent electrode 190.

Figure 3:
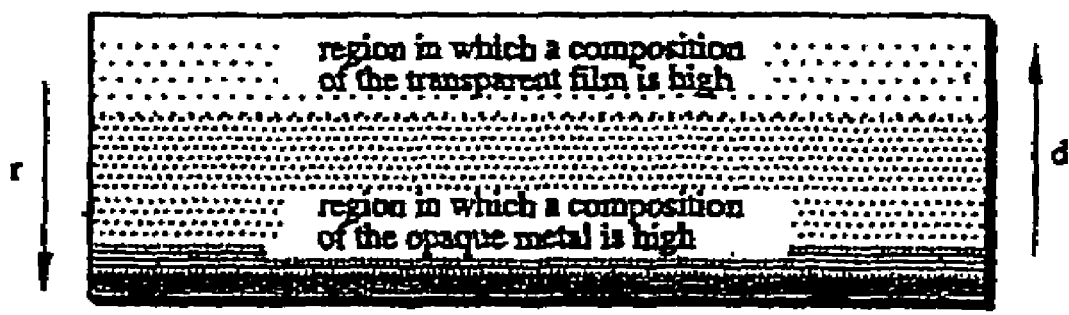
FIG. 3 is a drawing illustrating concentration gradients of a transparent conductive material and a metallic material of a first electrode that is used as a pixel electrode and a black matrix in an organic electroluminescent display device of the present invention.

FIG. 3 shows concentration gradients of a transparent conductive material and a metallic material of the first electrode 160. The first electrode 160 includes a first component of a transparent conductive material and a second component of a metallic material, and has a gradual concentration gradient corresponding to a deposition thickness of the first electrode 160.

That is, as illustrated in FIG. 3, the first electrode 160 is deposited in such a manner that the deeper an incidence depth "r" of external light is in an incidence direction, a concentration gradient of the first component of the transparent conductive material is gradually decreased while a concentration gradient of the second component of the metallic material is gradually increased. The rate of decrease/increase and the arrangement of the concentration gradients depend on a deposition thickness "d" of the first electrode 160, wherein the transparent conductive material and the metallic material exist in an almost equal ratio at about a half deposition thickness of the first electrode 160.

As described in the above, absorption rather than reflection of the external incident light occurs in the first electrode 160 since a composition ratio of the transparent conductive material and the metallic material is gradually and slowly changed by the gradual concentration gradients of the transparent conductive material and the metallic material. Therefore, the first electrode 160 functions as a black matrix which prevents reflection of the external light as reflection of the external light is inhibited by the first electrode 160.

Indium tin oxide (ITO), indium zinc oxide (IZO), zinc oxide (ZnO), etc., can used as a first component of a transparent conductive material of the first electrode 160, while Al, Cr, Mo, Ti, Ag, Au, W, etc., can used as a second component of a metallic material of the first electrode 160. The first electrode 160 is deposited by, for example, simultaneously cosputtering or coevaporating the metallic material and the transparent conductive material.

The first electrode 160 is deposited in such a manner that the deeper an incidence depth "e" of external light is, a transparent conductive material is gradually decreased while a metallic material is gradually increased, depending on a deposition thickness "d" of the first electrode 160. Accordingly, a part which contacts the drain electrode 142 through the via hole 155, that is, a bottom of the first electrode 160, is formed with a relatively high composition of the metallic material while a part which contacts the organic EL layer 180, that is, an upper surface of the first electrode 160, is formed with a relatively high composition of the transparent conductive material.

Therefore, although it has conventionally been difficult to use Al having a low resistivity as source/drain electrodes, due to diffusion problems between Al and ITO (which is used as a transparent conductive layer or a pixel electrode), an organic electroluminescent display device of the present invention is capable of using Al as the source/drain electrode material by using the first electrode 160, which has gradual concentration gradients of the transparent conductive material and the metallic material, as a pixel electrode.

That is, diffusion problems between Al and the pixel electrode do not occur, although Al is used as the source/drain electrodes, since a composition of the transparent conductive material is relatively low, and a composition of the metallic material is relatively high at a part where the first electrode 160 is in contact with the drain electrode 142. Therefore, since Al can be used as the source/drain electrodes in an organic electroluminescent display device of the present invention, a surface resistance of the source/drain electrodes as well as a contact resistance between the pixel electrode and the source/drain electrodes can be reduced.

The first electrode 160 is conductive since it functions as the pixel electrode and the black matrix at the same time. Therefore, the first electrode 160 should be separately formed per each pixel electrode of an organic electroluminescent display device. An organic electroluminescent display device according to the present invention has a structure in which a first electrode 160 is formed on a front surface of a pixel region defined by gate lines 130, data lines 140 and power supply lines 147, as illustrated in the planar structure of FIG. 2B. However, the structure is not limited thereto, and it is understood that other arrangements can be made so as to have the first electrode be electrically separated between each of the pixels.

Although a first electrode 160 having gradual concentration gradients of first and second materials is illustrated as both a pixel electrode and a black matrix with respect to a front light emitting type organic electroluminescent display device, it is understood that the present invention can be applied to other display devices including a reflection type liquid crystal display device.

Additionally, a display device of the present invention can be an all organic electroluminescent display device having an electrode layer, which does not transmit light from an organic thin layer formed between two electrodes, that functions as a first electrode.

A formation of an organic electroluminescent (EL) display device of the present invention is simple because a pixel electrode and a black matrix of the organic EL display device are formed at the same time using a conductive layer having gradual concentration gradients of a transparent conductive material and a metallic material.

In an organic EL display device of the present invention, a luminance is improved by preventing reflection of external light without the use of an expensive polarizer. Additionally shorts between wirings are prevented by preventing the formation of a surface profile due to the formation of a black matrix.

Furthermore, an organic EL display device of the present invention is capable of using Al having a low resistance as source/drain electrodes. A conductive layer, in which a part which contacts the source/drain electrodes has a low composition of an ITO and a high composition of a metallic material, is used as a pixel electrode. Accordingly, an Al-series material can be used as the source/drain electrodes, and a contact resistance between the source/drain electrodes and the pixel electrode is reduced.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A method of fabricating a flat panel display, the method comprising:
    forming a first electrode;
    forming at least one organic electroluminescent layer on the first electrode;
    forming a second electrode;
    wherein the first electrode comprises a first component of a transparent material and a second component of a metallic material, and
    the forming of the first electrode comprises depositing the first and second components so as to have a gradual concentration gradient in which the first component is decreased while the second component is increased at a part in contact with the exposed electrode, according to a thickness of the first electrode.

2. The method according to claim 1, wherein
    the first component of the first electrode is one of ITO, IZO and ZnO, and
    the second component is one of Al, Cr, Mo, Ti, Ag, Au and W.

3. The method according to claim 2, wherein the depositing of the first electrode comprises one of cosputtering and coevaporating the first component and the second component.

4. The method according to claim 2, wherein the first electrode functions as a black matrix as well as a pixel electrode of the display.

5. The method according to claim 1, wherein the second electrode is transparent.

6. The method according to claim 5, wherein the second electrode comprises one of ITO, IZO and ZnO.

* * * * *